(12) United States Patent
Van den Wildenberg

(10) Patent No.: US 7,368,733 B2
(45) Date of Patent: May 6, 2008

(54) CONTAMINATION BARRIER AND LITHOGRAPHIC APPARATUS COMPRISING SAME

(75) Inventor: Lambertus Adrianus Van den Wildenberg, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 204 days.

(21) Appl. No.: 11/392,951

(22) Filed: Mar. 30, 2006

(65) Prior Publication Data

US 2007/0228290 A1 Oct. 4, 2007

(51) Int. Cl.
*G21G 4/00* (2006.01)

(52) U.S. Cl. .............................. 250/492.2; 250/493.1; 250/504 R; 384/199

(58) Field of Classification Search ............. 250/492.1, 250/492.2, 493.1, 504 R; 384/199; 355/30, 355/53
See application file for complete search history.

(56) References Cited

U.S. PATENT DOCUMENTS

| | | | | |
|---|---|---|---|---|
| 1,498,535 | A * | 6/1924 | Bartholomew | 384/199 |
| 6,359,969 | B1 | 3/2002 | Shmaenok | 378/156 |
| 6,459,472 | B1 | 10/2002 | De Jager et al. | 355/68 |
| 6,838,684 | B2 | 1/2005 | Bakker et al. | 250/492.2 |
| 7,057,190 | B2 | 6/2006 | Bakker et al. | 250/492.2 |
| 2004/0108465 | A1* | 6/2004 | Bakker et al. | 250/492.1 |
| 2004/0184014 | A1 | 9/2004 | Bakker et al. | 355/30 |
| 2006/0012761 | A1 | 1/2006 | Bakker et al. | 355/30 |
| 2006/0061740 | A1* | 3/2006 | Bakker et al. | 355/30 |
| 2006/0138348 | A1 | 6/2006 | Bakker | 250/492.1 |
| 2006/0138362 | A1 | 6/2006 | Bakker et al. | 250/504 |
| 2006/0151717 | A1 | 7/2006 | Klunder et al. | 250/492.2 |

FOREIGN PATENT DOCUMENTS

| EP | 1 211 918 A1 | 6/2002 |
|---|---|---|
| EP | 1211918 A1 * | 6/2002 |
| EP | 1 274 287 A1 | 1/2003 |
| EP | 1274287 A1 * | 1/2003 |
| EP | 1 491 963 A2 | 6/2004 |
| EP | 1 491 963 A3 | 12/2004 |

OTHER PUBLICATIONS

U.S. Appl. No. 11/493,848, filed Jul. 27, 2006, Levinus Pieter Bakker.
U.S. Appl. No. 11/481,252, filed Jul. 6, 2006, Leonid Aizikovitch Sjmaenok.
U.S. Appl. No. 11/433,761, filed May 15, 2006, Arnoud Cornelis Wassink.
U.S. Appl. No. 11/391,691, filed Mar. 29, 2006, Arnoud Cornelis Wassink.

(Continued)

*Primary Examiner*—Robert Kim
*Assistant Examiner*—Michael Maskell
(74) *Attorney, Agent, or Firm*—Pillsbury Winthrop Shaw Pittman, LLP

(57) ABSTRACT

A rotatable contamination barrier for use with an EUV radiation system is disclosed. The contamination barrier has a blade structure configured to trap contaminant material coming from a radiation source, a bearing structure, coupled to a static frame, configured to rotatably bear the blade structure, and an eccentric mass element displaced relative to a central axis of rotation to balance the blade structure in the bearing structure.

19 Claims, 3 Drawing Sheets

OTHER PUBLICATIONS

U.S. Appl. No. 11/319,190, filed Dec. 28, 2005, Derk Jan Wilfred Klunder.

U.S. Appl. No. 11/294,347, filed Dec. 6, 2005, Derk Jan Wilfred Klunder.

U.S. Appl. No. 11/175,036, filed Jul. 6, 2005, Leonid Aizikovitch Sjmaenok.

U.S. Appl. No. 11/133,460, filed May 20, 2005, Maarten Marinus Johannes Wilhelmus Van Herpen.

PCT Invitation to Pay Additional Fees Issued for PCT Patent Application No. PCT/NL2007/050107, dated Jul. 2, 2007.

* cited by examiner

CONTAMINATION BARRIER AND LITHOGRAPHIC APPARATUS COMPRISING SAME

FIELD

The present invention relates to a contamination barrier and a lithographic apparatus comprising same.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive metal compound (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Radiation sources used in EUV lithography typically generate contaminant material that is harmful to the optics and the working environment wherein the lithographic process is carried out. Such is especially the case for EUV sources operating via a laser induced plasma or discharge plasma. Hence, in EUV lithography, a desire exists to limit the contamination of the optical system arranged to condition the beam of radiation coming from an EUV source. To this end, a foil trap, for instance, as disclosed in European patent application publication EP1491963, has been proposed. A foil trap uses a high number of closely packed foils or blades. Contaminant debris, such as micro-particles, nano-particles and ions can be trapped in the walls provided by the blades. Thus, the foil trap functions as a contamination barrier trapping contaminant material from the source.

SUMMARY

In an embodiment, a rotatable foil trap may be oriented with an axis of rotation oriented along an optical axis of the system, in particular in front of an extreme ultraviolet radiation source configured to provide extreme ultraviolet radiation. The blades configured to trap contaminant material thus may be radially-oriented relative to a central rotating shaft of the contamination barrier and may be aligned substantially parallel to the direction of radiation. By rotating the foil trap at a sufficiently high speed, traveling contaminant debris may be captured by the blades of the contaminant barrier. Due to design limitations, the rotation speed of the contaminant barrier may be quite high, since otherwise the length of the blades along the direction of travel of the debris would be unacceptably large. Typical revolution speeds are 15000-30000 RPM. Furthermore, the foil trap is operated in (near) vacuum conditions, which gives special constraints to the type of bearing that can be used for the rotating foil trap. In particular, one type of bearing that may be used is a gas bearing, wherein the rotating shaft of the foil trap is borne by gas (e.g., air) pressure. To not compromise the vacuum conditions, the gap present between the shaft and such a bearing should be kept very small, typically only several microns. A consequence of such an arrangement is that there may be imbalance of the foil trap. Such imbalance may be detrimental to the vacuum and/or to the operation of the machine.

It is desirable, for example, to provide a rotatable contamination barrier that has improved balancing properties.

According to an aspect of the invention, there is provided a rotatable contamination barrier for use with an EUV radiation system, the barrier comprising:

a blade structure configured to trap contaminant material coming from a radiation source;

a bearing structure, coupled to a static frame, configured to rotatably bear the blade structure; and an eccentric mass element displaced relative to a central axis of rotation to balance the blade structure in the bearing structure.

According to an aspect of the invention, there is provided a balancing unit to balance a rotatable contamination barrier, the unit comprising:

a bearing structure configured to bear a blade structure of the rotatable contamination barrier;

a imbalance sensor unit configured to provide a signal of a sensed imbalance of the blade structure in the bearing structure during rotation of the blade structure; and a calculating unit configured to calculate a location to provide one or more eccentric mass elements on or to the blade structure and the amount of such mass, the calculating unit communicatively coupled to the imbalance sensor.

According to an aspect of the invention, there is provided a method of balancing a rotatable contamination barrier for use in an EUV radiation system, comprising:

bearing a blade structure in a bearing structure provided in a vacuum environment;

sensing an imbalance of the blade structure in the bearing structure during rotation of the blade structure; and calculating, based on the sensed imbalance, a location to provide an eccentric mass element on or to the blade structure and an amount of such mass.

According to an aspect of the invention, there is provided a method of cleaning a rotatable contamination barrier for use with an EUV radiation system, comprising:

adjusting an eccentric mass element of a blade structure of the contamination barrier to provide an imbalance; and rotating the blade structure with the imbalance to shake clean the contamination barrier.

According to an aspect of the invention, there is provided a lithographic apparatus, comprising:

a rotatable contamination barrier configured to receive a beam of radiation, the contamination barrier comprising a blade structure configured to trap contaminant material coming from a radiation source, a bearing structure, coupled to a static frame, configured to rotatably bear the blade structure, and an eccentric mass element displaced relative to a central axis of rotation to balance the blade structure in the bearing structure;

an illumination system configured to condition the radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
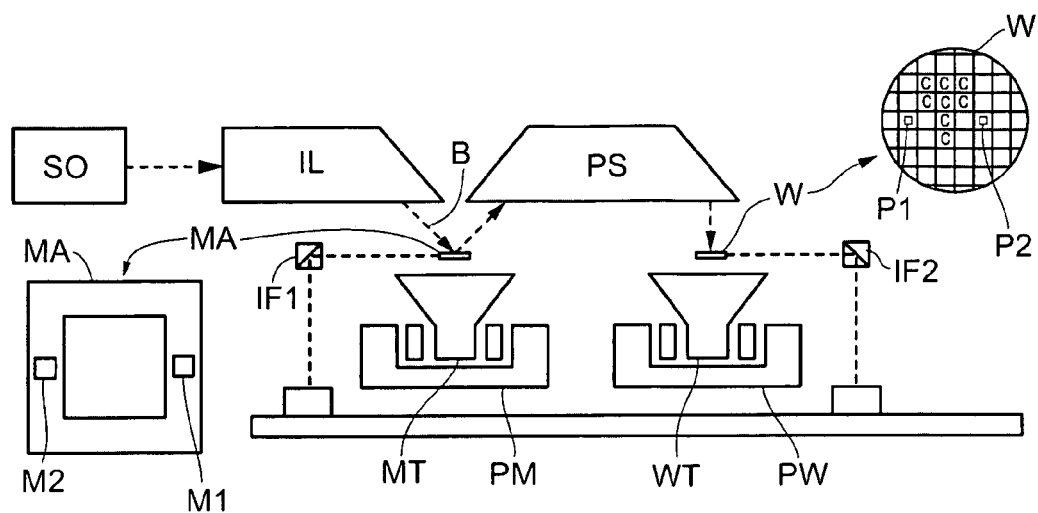
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
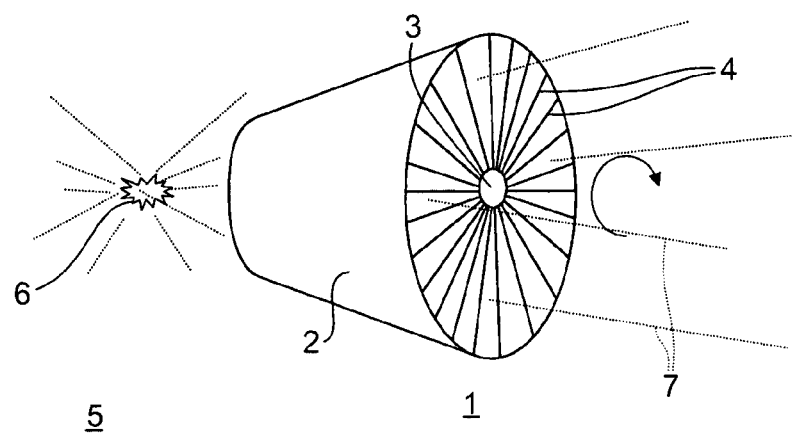
FIG. 2 shows a general setup of a rotating foil trap according to an embodiment of the invention.

Although the principles of one or more embodiments of the invention may be applied to a rotatable contamination barrier having any rotatable blade structure, FIG. 2 schematically shows an exemplary embodiment of a rotatable contamination barrier or foil trap 1 wherein the blade structure 2 is comprised of a central rotation shaft 3 with blades or foils 4 mounted thereon. The barrier 1 is typically used in or with a radiation system 5 to provide a projection beam of radiation. In an embodiment, the radiation system 1 comprises an extreme ultraviolet radiation source 6 configured to provide extreme ultraviolet radiation. In FIG. 2, the dashed lines represent EUV radiation 7 coming from EUV source 6, typically a laser induced plasma source or a plasma discharge source such as a tin, lithium or xenon source, however, other sources are possible, in particular, any other source that produces EUV radiation in combination with fast particles that escape from the source 6 and that should be trapped in order to prevent damage to the downstream optics of the lithographic apparatus (not shown). To this end, the blade structure 2 is provided with a plurality of closely packed blades 4 configured to trap contaminant material coming from the radiation source 6. In the exemplary embodiment, the blades 4 are radially oriented relative to a central rotation shaft 3 of the contamination barrier 1. By rotation of the blades 4, fast moving particles, in particular, tin particles and gaseous and ion like particles traveling away from the source 6 can be trapped while EUV radiation, due to the speed of light, can travel generally unhindered by the blades 4.

The foil trap 1 thus functions as a contamination barrier to trap contaminant material coming from the radiation source 6. Typically, the blades 4 are arranged at a distance of 0.3-5 mm apart and have a generally rectangular form. Advantageously, the source 6 is positioned at an intersection of extended planes through the plurality of blades 4 which define an optical center of the contamination barrier 5, which in FIG. 2 coincides with the rotation shaft 3 of the foil trap 1. For an ideal point like EUV source 6 at this center, radiation would pass in a direction generally parallel to an orientation of the blades 4. Thus, shielding of EUV radiation is low and only takes place over a thickness of the blade (which, in an embodiment, is accordingly kept small without compromising mechanical integrity). A typical value of the thickness of the blade can be about 100 microns, which may result in a shielding of about 10 percent of the radiation.

Figure 3:
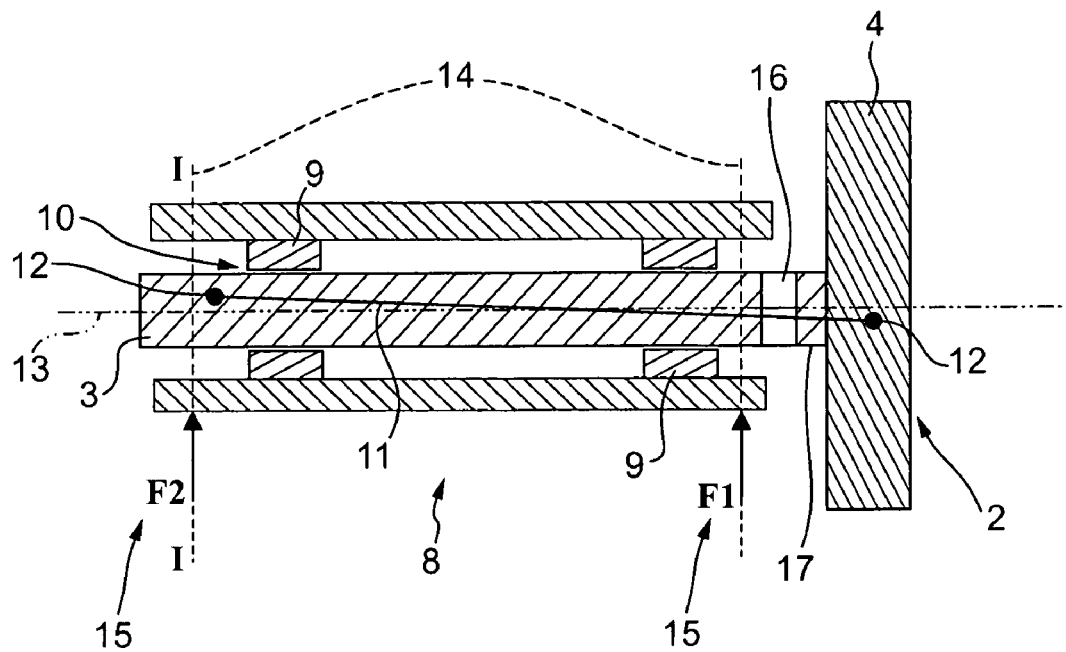
FIG. 3 shows a schematic axial cross-sectional view of the rotating foil trap according to FIG. 2.

FIG. 3 shows a schematic view of an axial cross-sectional view of a rotating foil trap such as illustrated in FIG. 2. In particular, FIG. 3 shows a central rotating shaft 3 which is mounted in a bearing structure 8, which comprises, in the context of this embodiment, two gas bearings 9 enclosing the shaft 3. The gas bearings 9 are operated in a vacuum environment, which poses special constraints on the gap 10 between the shaft 3 and the bearings 9. For example, the gap 10 should be very small in order not to pose problems for the vacuum environment. Thus, reducing or minimizing eccentric movements of the shaft 3 should allow for a smaller gap 10, which would be beneficial to operation in a vacuum environment.

Figure 4:
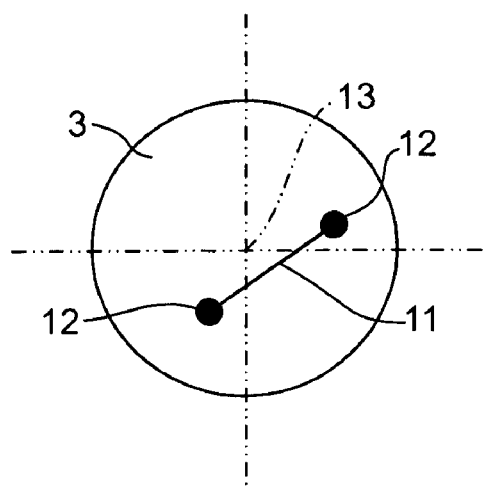
FIG. 4 shows a schematic lateral cross-sectional view of the rotating foil trap according to FIG. 3.

In FIG. 3, a modeled representation of an axis of inertia 11 is schematically indicated. FIG. 4 shows a schematic lateral cross-sectional view of the rotating foil trap according to FIG. 3 along line I-I, showing the axis of inertia viewed along an axial direction. The axis of inertia, for a rigid elongate body, can be represented by two off-centered masses 12 at the respective ends of the axis, which are schematically illustrated as not coincident with a central (geometrical) axis of rotation 13.

To reduce or eliminate the eccentricity of the axis of inertia, one or more eccentric mass elements (see FIG. 6) may be provided in at least two planes 14 lateral the central axis of rotation 13. In an embodiment, the one or more corrective masses are provided in the same planes 14 as is measured (as discussed below), but other lateral planes are possible when taking into account the specific geometry of the blade structure 2.

In an embodiment, the imbalance of the blade structure 2 is measured by two force sensors 15 which sense a force in a single dimension, in two planes 14 spaced apart from each other along the central axis of rotation 13. The blade structure 2 is mounted rigidly in another direction than the measuring direction (see FIG. 5). The force sensors 15 thus measure an eccentric displacement of the blade structure 2 in a lateral plane. In an embodiment, also in this plane, one or more eccentric mass elements (see FIG. 6) are provided relative to the central axis of rotation 13 in order to avoid recalculation necessary for geometric deviations.

The shaft 3 further comprises a coupling element 16 connecting the shaft part that is borne by the gas bearings 9 to the shaft part 17 to which the blades 4 are mounted. The coupling element 16 is formed of a material having a relatively low thermal conductivity compared to the material of the shaft 3, which, due to the relevant operating temperature range of 800-1200° C., may be a molybdenum alloy. A suitable material for the coupling element 16 to provide the thermal isolation is tantalum, because, for example, the coefficients of thermal expansion of the shaft 3 and the coupling element 16 would then almost match (5 μ/m-K for molybdenum while 6 μ/m-K for tantalum).

Figure 5:
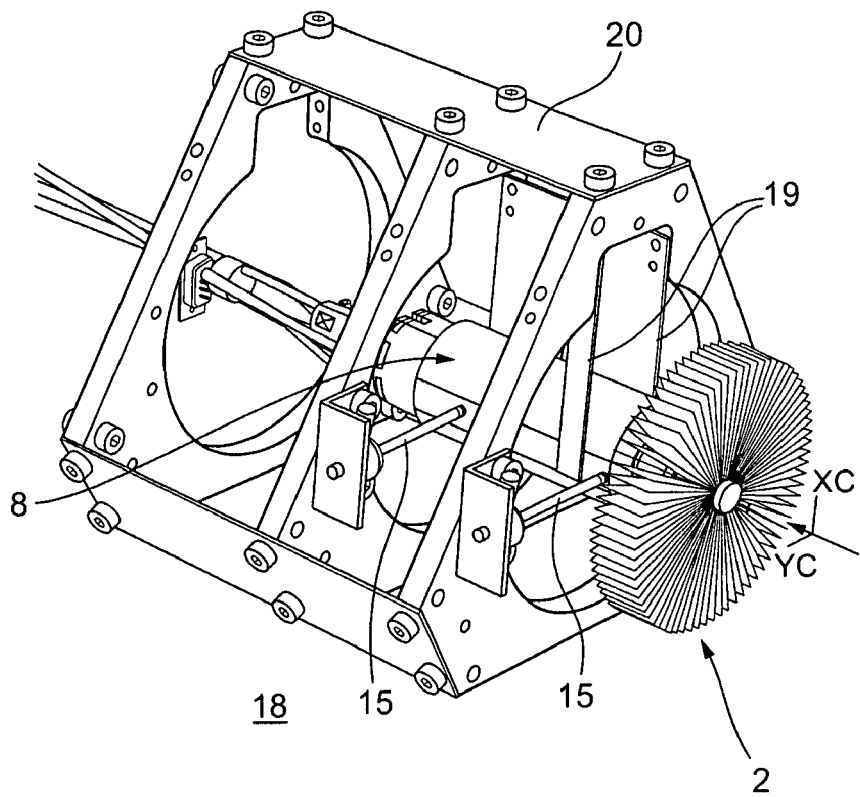
FIG. 5 shows schematically an exploded view of a balancing unit according to an embodiment of the invention.

FIG. 5 shows schematically an exploded view of a balancing unit 18 according to an embodiment of the invention. The balancing unit can be used as a test setup to test the balancing properties of the foil trap, in particular, of the blade structure 2. The blade structure 2 (including the gas bearing structure 8) may be taken out of the operative environment of the foil trap and inserted in the setup 18 as illustrated in FIG. 5. Due to the fragility of the blade structure 2, the balancing procedure should be carried out in vacuum conditions, therefore the balancing unit would be operated in a vacuum chamber (not shown). Furthermore, the (initial) test rotation frequency is usually much lower, typically about 20-50 Hz, than the operating rotation frequency of the foil trap.

In a balanced condition, the rotation frequency of the blade structure 2 may be typically a factor ten higher. As discussed with reference to FIG. 2, force sensors 15 are present to sense a force variation in one direction in order to provide a direct measurement of the imbalance of the blade structure 2. Alternatively, other imbalance sensing methods may be used, in particular, a displacement sensor which can be contactless or the like. The gas bearing structure 8 is stabilized by leaf springs 19 mounted in a rigid frame 20, which effectively limit the freedom of movement to a single direction. In addition, a rotation sensor is present (not shown) to sense a rotation angle of the blade structure 2. Based on the sensed force variations from the force sensors 15 and the rotation angle from the rotation sensor, a calculating unit (not shown) calculates a location to add one or more eccentric mass element to the blade structure as well as the amount of mass that should be added.

Figure 6:
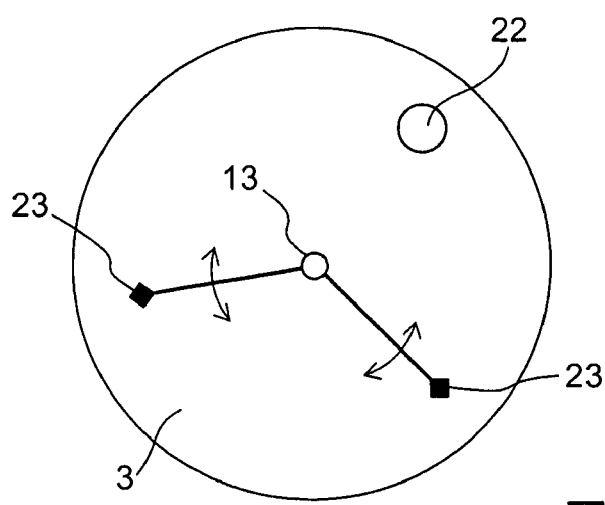
FIG. 6 shows an embodiment of an automatic balancing mechanism.

FIG. 6 shows a practical embodiment that may be used for automatic adjustment of the imbalance that is measured. This embodiment allows for a continuous operation in an operative environment of the foil trap 1. In particular, when a blade is accidentally lost or deformed in the blade structure 2, or if an imbalance is caused by an uneven spread of colliding debris from the radiation source 6, balance may be restored by adjustment of the balance weights.

In addition to the imbalance measurement sensors 15 detailed with respect to FIGS. 2 and 5, an adjustment unit 21 may be provided to provide automatic adjustment of one or more eccentric mass elements in response to an imbalance signal caused by an eccentricity schematically illustrated by item 22. Typically, along the central axis of rotation 13, at least two of these adjustment units 21 may be used to balance the elongated geometrical form of the foil trap 1. The adjustment unit 21, in an embodiment, comprises a pair of rotatable mass elements 23, which may be positioned freely relative to the shaft 3 and provide an effective eccentric mass that is adjustable relative to the central axis of rotation 13. Additionally or alternatively, other types of providing one or more (effective) eccentric mass elements are feasible, including adding, shifting and/or removing mass from or attached to the rotatable shaft 3. For non-automatic adjustment, such as using the balancing unit detailed in FIG. 5, a way of balancing is to provide eccentric bore holes in the rotatable shaft. In na embodiment, an aspect of the automatic balancing unit or other balancing mechanism is that it may allow for creation of a temporary imbalance, the temporary imbalance causing vibrations that may be effective in cleaning cycles when cleaning the barrier 1.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A rotatable contamination barrier for use with an EUV radiation system, the barrier comprising:
    a blade structure configured to trap contaminant material coming from a radiation source;
    a bearing structure, coupled to a static frame, configured to rotatably bear the blade structure; and
    an eccentric mass element displaced relative to a central axis of rotation to balance the blade structure in the bearing structure.

2. The barrier of claim 1, wherein a plurality of eccentric mass elements are provided in at least two planes displaced laterally along the central axis of rotation.

3. The barrier of claim 1, wherein the eccentric mass element is displaceable relative to the central axis of rotation.

4. The barrier of claim 3, further comprising:
    a imbalance sensor configured to provide a signal of a sensed imbalance of the contamination barrier in the bearing structure; and
    an adjustment unit configured to automatically adjust the eccentric mass element in response to the signal.

5. The barrier of claim 4, wherein the imbalance sensor unit is configured to measure an eccentric displacement of the blade structure in a lateral plane that is the same as or parallel to the lateral plane wherein the eccentric mass element is provided.

6. The barrier of claim 1, wherein the bearing structure is configured to be operated in a vacuum environment and comprises a gas bearing.

7. The barrier of claim 1, wherein the blade structure comprises a rotatable shaft and a plurality of closely packed blades mounted to the rotatable shaft, the blades radially oriented relative to the rotatable shaft.

8. The barrier of claim 7, wherein the eccentric mass element comprises an addition of mass to the rotatable shaft, a shift of mass on or in the rotatable shaft, removal of mass from the rotatable shaft, or any combination of the foregoing.

9. The barrier of claim 7, wherein the rotatable shaft is thermally stabilized against thermal energy imparted on the plurality of blades by EUV radiation and/or debris.

10. The barrier of claim 9, wherein the rotating shaft comprises a thermally stabilizing coupling element configured to couple a shaft part that is borne in the bearing structure and a shaft part that provides a mount to the blade structure.

11. The barrier of claim 10, wherein the shaft part borne in the bearing structure comprises an alloy comprising molybdenum and wherein the coupling element is comprised of an alloy comprising tantalum.

12. A balancing unit to balance a rotatable contamination barrier, the unit comprising:
    a bearing structure configured to bear a blade structure of the rotatable contamination barrier;
    a imbalance sensor unit configured to provide a signal of a sensed imbalance of the blade structure in the bearing structure during rotation of the blade structure; and
    a calculating unit configured to calculate a location to provide one or more eccentric mass elements on or to the blade structure and the amount of such mass, the calculating unit communicatively coupled to the imbalance sensor.

13. The balancing unit of claim 12, wherein the calculating unit is configured to calculate a location of the one or more eccentric mass elements in a lateral plane that is the same as or parallel to a lateral plane wherein the imbalance sensor unit senses the imbalance.

14. The balancing unit of claim 13, wherein the bearing structure is configured to be mounted in a vacuum environment and comprises a gas bearing.

15. The balancing unit of claim 12, wherein the imbalance sensor unit comprises a plurality of force sensors configured to measure a force exerted on the bearing structure by the blade structure when rotating.

16. A method of balancing a rotatable contamination barrier for use in an EUV radiation system, comprising:
    bearing a blade structure in a bearing structure provided in a vacuum environment;
    sensing an imbalance of the blade structure in the bearing structure during rotation of the blade structure; and
    calculating, based on the sensed imbalance, a location to provide an eccentric mass element on or to the blade structure and an amount of such mass.

17. The method of claim 16, further comprising:
    providing the blade structure with an eccentric mass element to balance the blade structure in the bearing structure; and
    automatically adjusting the eccentric mass element in response to the imbalance signal.

18. A method of cleaning a rotatable contamination barrier for use with an EUV radiation system, comprising:
    adjusting an eccentric mass element of the contamination barrier to provide an imbalance; and
    rotating the contamination barrier with the imbalance to shake clean the contamination barrier.

19. A lithographic apparatus, comprising:

a rotatable contamination barrier configured to receive a beam of radiation, the contamination barrier comprising a blade structure configured to trap contaminant material coming from a radiation source, a bearing structure, coupled to a static frame, configured to rotatably bear the blade structure, and an eccentric mass element displaced relative to a central axis of rotation to balance the blade structure in the bearing structure;

an illumination system configured to condition the radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate.

* * * * *